United States Patent
Pendse

(10) Patent No.: US 7,608,921 B2
(45) Date of Patent: Oct. 27, 2009

(54) MULTI-LAYER SEMICONDUCTOR PACKAGE

(75) Inventor: Rajendra D. Pendse, Fremont, CA (US)

(73) Assignee: STATS ChipPAC, Inc., Fremont, CA (US)

( * ) Notice: Subject to any disclaimer, the term of this patent is extended or adjusted under 35 U.S.C. 154(b) by 0 days.

(21) Appl. No.: 11/608,164

(22) Filed: Dec. 7, 2006

(65) Prior Publication Data

US 2008/0136003 A1 Jun. 12, 2008

(51) Int. Cl.
H01L 23/488 (2006.01)
H01L 23/48 (2006.01)
H01L 21/56 (2006.01)

(52) U.S. Cl. .............................. 257/686; 257/E23.023; 257/E21.502; 257/E25.013; 257/E25.023; 257/777; 257/723; 257/784; 257/778; 257/738; 257/737

(58) Field of Classification Search .................. 257/686, 257/E23.023, E21.502, E25.013, E25.023, 257/685, 777, 723, 784, 786, 737, 738, 734, 257/778, 779, 780, 772, 678, 724, 725, 728; 438/109
See application file for complete search history.

(56) References Cited

U.S. PATENT DOCUMENTS

| | | | |
|---|---|---|---|
| 6,339,254 B1 * | 1/2002 | Venkateshwaran et al. .. | 257/686 |
| 6,558,978 B1 * | 5/2003 | McCormick ................ | 438/108 |
| 6,774,478 B2 * | 8/2004 | Eto et al. ..................... | 257/686 |
| 6,828,665 B2 | 12/2004 | Pu et al. | |
| 6,838,761 B2 | 1/2005 | Karnezos | |
| 6,861,288 B2 | 3/2005 | Shim et al. | |
| 7,180,165 B2 * | 2/2007 | Ellsberry et al. ............. | 257/686 |
| 7,429,786 B2 * | 9/2008 | Karnezos et al. ............. | 257/686 |
| 2002/0113308 A1 * | 8/2002 | Huang et al. ................. | 257/717 |
| 2003/0137041 A1 * | 7/2003 | Blackshear et al. ......... | 257/686 |
| 2004/0036164 A1 * | 2/2004 | Koike et al. ................. | 257/723 |
| 2004/0089943 A1 * | 5/2004 | Kirigaya et al. ............. | 257/723 |
| 2004/0113253 A1 | 6/2004 | Karnezos | |
| 2005/0012195 A1 * | 1/2005 | Go et al. ..................... | 257/686 |
| 2006/0110849 A1 * | 5/2006 | Lee et al. .................... | 438/106 |
| 2007/0181990 A1 * | 8/2007 | Huang et al. ................ | 257/686 |

(Continued)

OTHER PUBLICATIONS

Allan, "SiP Really Packs It In," *Electronic Design*, Nov. 29, 2004, 13 pages [http://www.elecdesign.com/Articles/Print.cfm?ArticleID-9175].

(Continued)

*Primary Examiner*—Alexander O Williams

(57) ABSTRACT

A semiconductor package comprises a base substrate with a semiconductor die mounted on a top side of the base substrate and an interposer substrate mounted on top of the die. The bottom side of the interposer substrate can be electrically coupled to the top side of the base substrate through vertical connectors. The top side of the interposer substrate is substantially exposed and comprises input/output (I/O) terminals for the mounting of additional electronic components. The base and interposer substrates can be configured with I/O terminals such that components mounted on the substrates can be electrically coupled through the vertical connectors. The base substrate also can be electrically coupled to an additional electronic component, such as a printed circuit board. Electrical connections can be "wrapped around" from the base substrate to the top of the interposer substrate. The vertical connectors can be positioned along multiple sides of the package, which can increase routing space between the substrates.

24 Claims, 6 Drawing Sheets

U.S. PATENT DOCUMENTS

| | | | |
|---|---|---|---|
| 2007/0210433 A1* | 9/2007 | Subraya et al. | 257/686 |
| 2007/0254404 A1* | 11/2007 | Gerber et al. | 438/109 |
| 2008/0017966 A1* | 1/2008 | Williams et al. | 257/686 |
| 2008/0029869 A1* | 2/2008 | Kwon et al. | 257/686 |
| 2008/0042250 A1* | 2/2008 | Wilson et al. | 257/686 |
| 2008/0057624 A1* | 3/2008 | Lee | 438/109 |
| 2008/0136007 A1* | 6/2008 | Kim et al. | 257/686 |
| 2008/0150115 A1* | 6/2008 | Watanabe et al. | 257/686 |

OTHER PUBLICATIONS

Aguirre, "Super High Density Packaging Technologies," Fujitsu Microelectronics America, Inc., Sep. 2002, 23 pages.

"Data Sheet—Package Stackable Very Thin Fine Pitch BGA (PSvfBGA)," Amkor Technology, Apr. 2006, 2 pages.

"Data Sheet—Stacked CSP (S-CSP)," Amkor Technology, Jul. 2005, 2 pages.

Pendse, "Future Directions in Package-level Integration," *APIA Symposium*, Jul. 15, 2004, 18 pages.

Pendse et al., "Bond-on-Lead: A Novel Flip Chip Interconnection Technology for Fine Effective Pitch and High I/O Density," *Electronic Components and Technology Conference*, May 30-Jun. 2, 2006.

* cited by examiner

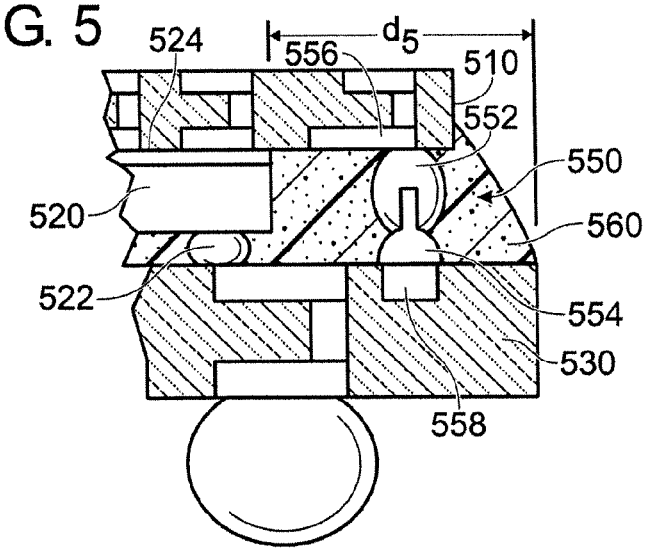
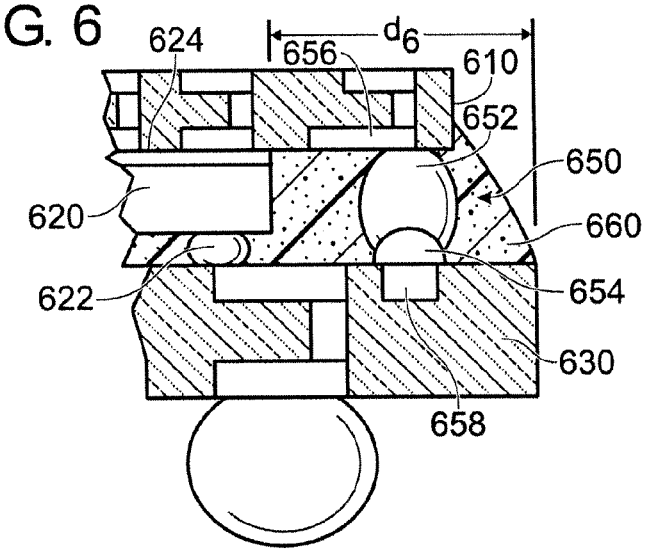
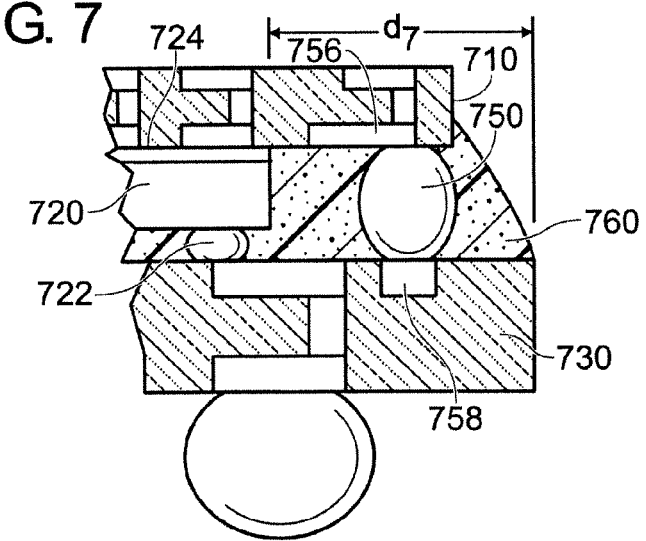

MULTI-LAYER SEMICONDUCTOR PACKAGE

FIELD

This disclosure relates to semiconductor packaging.

BACKGROUND

Electronic devices often employ multiple semiconductor components, e.g., several microchips. Some devices can be implemented in "multi-chip modules" that typically comprise a printed circuit board (PCB) substrate onto which a set of separate microchips is directly attached. Such multi-chip modules can increase circuit density and miniaturization, but they also can be bulky.

One method for reducing the size of multi-chip modules and thereby increasing their effective density is to stack the die or chips vertically. Conventional examples of this approach are the package-on-package (PoP) and package-in-package (PiP) configurations which can save space, e.g., on a PCB. These packages can be, for example, on the order of about 15 mm square, with a height of about 2 mm.

Some package designs place an interposer above a die. For example, U.S. Pat. No. 6,861,288 to Shim et al. discloses: "A method for fabricating a stacked semiconductor package includes providing a substrate and mounting a first semiconductor device on the substrate. An interposer is supported above the first semiconductor device opposite the substrate. The interposer is electrically connected to the substrate. A second semiconductor device is then mounted on the interposer." See Abstract. However, this design can result in a package with an area much larger than the area of the packaged die.

In view of the above, improved semiconductor packages and packaging methods are needed.

SUMMARY

A semiconductor package can comprise a base substrate with a semiconductor die mounted on the top side of the base substrate, and with an interposer substrate mounted on top of the die. The bottom side of the interposer substrate can be electrically coupled to the top side of the base substrate through vertical connectors. The top side of the interposer substrate is substantially exposed for the mounting of additional electronic components. The base and interposer substrates can be configured with input/output (I/O) terminals such that components mounted on the substrates can be electrically coupled with each other through the vertical connectors. The base substrate also can be electrically coupled to an additional electronic component, such as a PCB.

In one embodiment, a semiconductor package comprises a first substrate having first and second major planar surfaces defined by a first perimeter, a first semiconductor die electrically coupled to the second major planar surface of the first substrate, a second substrate having first and second major planar surfaces defined by a second perimeter, a first plurality of vertical connectors configured to electrically couple the first major planar surface of the second substrate to the second major surface of the first substrate, and a first encapsulating resin situated between the semiconductor die and the second surface of the first substrate, the encapsulating resin also encompassing at least a portion of at least some of the vertical connectors, wherein the vertical connectors are positioned substantially within the first perimeter and the second perimeter, and wherein the second major planar surface of the second substrate is substantially available for receiving one or more electronic components. The first semiconductor die can be electrically coupled to the second major planar surface of the first substrate in a flip chip configuration. In other embodiments, the first semiconductor die is electrically coupled to the second major planar surface of the first substrate with at least one bond wire.

The package can further comprise a second encapsulating resin situated between the second surface of the first substrate and the first surface of the second substrate. In some embodiments the first encapsulating resin and the second encapsulating resin comprise a continuous encapsulating resin. In further embodiments, at least one of the first plurality of vertical connectors comprises a bond-on-lead (BOL) connection. In additional embodiments, at least one of the first plurality of vertical connectors comprises a stud bump. In some embodiments, the first encapsulating resin comprises at least one of an epoxy material, a thermosetting material, and a thermoplastic material.

In some embodiments, the second major planar surface of the second substrate is configured to receive an electronic component. The second major planar surface of the second substrate can be further configured to receive a ball grid array, at least part of the ball grid array having a ball pitch between about 0.25 mm and about 1.0 mm. In other embodiments, the second major planar surface of the second substrate can be configured to receive at least one of the following: a flip chip component, a quad flat package, a quad flat package no leads, a molded package, or a passive component. In other embodiments of the semiconductor package, the first perimeter comprises a plurality of perimeter sides, and wherein at least some of the first plurality of vertical connectors are situated at two, three, four or more of the perimeter sides. In some embodiments, at least some of the first plurality of vertical connectors are generally diametrically opposed along at least one of the first and second perimeter.

In additional embodiments, the first substrate has a first substrate edge and the first semiconductor die has a first die edge, and the horizontal distance between the first die edge and the first substrate edge is between about 0.25 mm and about 1.5 mm. In further embodiments, the distance is between about 0.25 mm and about 1.0 mm. In other embodiments the horizontal distance is approximately equal to a vertical connector width. In further embodiments, the vertical distance between a surface of the first semiconductor die facing the first substrate and the first major planar surface of the second substrate is less than about 0.2 mm.

In other embodiments, the semiconductor package further comprises: a third substrate having first and second major planar surfaces defined by a third perimeter; a second semiconductor die electrically coupled to the second major planar surface of the third substrate; and a second plurality of vertical connectors, the connectors being configured to electrically couple the first major planar surface of the first substrate to the second major planar surface of the third substrate.

In an additional embodiment, a method of fabricating a semiconductor package comprises: providing a first substrate, a semiconductor die, a second substrate, and one or more vertical connectors, the first and second substrates both having first and second major planar surfaces; electrically coupling the die to the second major planar surface of the second substrate through the second major planar surface of the first substrate, the first major planar surface of the second substrate, and at least one of the one or more vertical connectors, wherein electrically coupling the die comprises coupling at least one or more vertical connectors to the second major planar surface of the first substrate; and providing an encapsulating resin between the die and the first substrate, wherein the encapsulating resin is provided after the coupling of the at least one or more of the vertical connectors to the second major planar surface of the first substrate, and wherein the second major planar surface of the second substrate is substantially available for receiving one or more electronic components. The method can further comprise providing an encapsulating resin between the first substrate and the second substrate. A portion of the encapsulating resin can be between the die and the first substrate, and a portion can be between the first substrate and the second substrate, the portions being provided substantially simultaneously. In some embodiments, the encapsulating resin is provided by printing encapsulation, transfer molding, no flow underfill dispensing, or other molding, underfilling, or encapsulation process.

In some embodiments of the method, electrically coupling the die to the second major planar surface of the second substrate can comprise: electrically coupling the die to the second major surface of the first substrate; and electrically coupling the second surface of the first substrate with the first surface of the second substrate through the one or more vertical connectors. Electrically coupling the die to the second major planar surface of the second substrate through the second major planar surface of the first substrate can comprise attaching the die to the second major planar surface of the first substrate with a plurality of solder balls, and approximately simultaneously reflowing the one or more vertical connectors and the solder balls.

In further embodiments of the method, the first substrate has a first edge and the die has a first edge, and wherein the horizontal distance between the first edge of the die and the first edge of the first substrate is between about 0.25 mm and about 1.5 mm. In additional embodiments, the horizontal distance is between about 0.25 mm and about 1.0 mm.

In some embodiments of the method, the steps of attaching the semiconductor die and providing the second substrate are performed substantially simultaneously. In other embodiments, the method further comprises electrically coupling an additional semiconductor device to the second major planar surface of the second substrate.

Other embodiments of the disclosed technology include a semiconductor package made according to one or more embodiments of the method disclosed herein.

In some further embodiments, a semiconductor package comprises a first substrate having first and second major planar surfaces defined by a first perimeter, the second major planar surface having a semiconductor die coupled thereto, and a second substrate consisting of first and second major planar surfaces defined by a second perimeter, the first major planar surface of the second substrate being effectively coupled to the second major planar surface of the first substrate by one or more vertical connectors, wherein the vertical connectors are positioned substantially within the first perimeter and the second perimeter, wherein the first substrate has a first substrate edge and the die has a first substrate edge, and wherein the horizontal distance between the first die edge and the first substrate edge is between about 0.25 mm and about 1.5 mm.

The foregoing and other objects, features, and advantages of the disclosed technologies will become more apparent from the following detailed description, which proceeds with reference to the accompanying figures.

BRIEF DESCRIPTION OF THE DRAWINGS

FIG. 5 is a close-up, cross-sectional view of one embodiment of a vertical connector.

FIG. 6 is a close-up, cross-sectional view of one embodiment of a vertical connector.

FIG. 7 is a close-up, cross-sectional view of one embodiment of a vertical connector.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" means electrically, electromagnetically or mechanically coupled or linked and does not exclude the presence of intermediate elements between the coupled items.

Although the operations of example embodiments of the disclosed method are described in a particular, sequential order for convenient presentation, it should be understood that disclosed embodiments can encompass an order of operations other than the particular, sequential order disclosed. For example, operations described sequentially may in some cases be rearranged or performed concurrently. Moreover, for the sake of simplicity, the attached figures may not show the various ways (readily discernable, based on this disclosure, by one of ordinary skill in the art) in which the disclosed system, method, and apparatus can be used in conjunction with other systems, methods, and apparatuses. Additionally, the description sometimes uses terms like "produce" and "provide" to describe the disclosed method. These terms are high-level abstractions of the actual operations that can be performed. For example, "providing" a component can mean making that component available for use or configuration with additional components. The actual operations that correspond to these terms can vary depending on the particular implementation and are, based on this disclosure, readily discernible by one of ordinary skill in the art.

The term "horizontal" as used herein is defined as being in the plane of the major planar opposed surfaces of the appropriate component, regardless of the component's orientation. The term "vertical" refers to a direction generally perpendicular to the horizontal as just defined. Terms, such as "on," "above," "below," "bottom," "top," "side," "higher," "lower," and "under," are defined with respect to the horizontal plane.

Exemplary Embodiments of a Semiconductor Package

Figure 1:
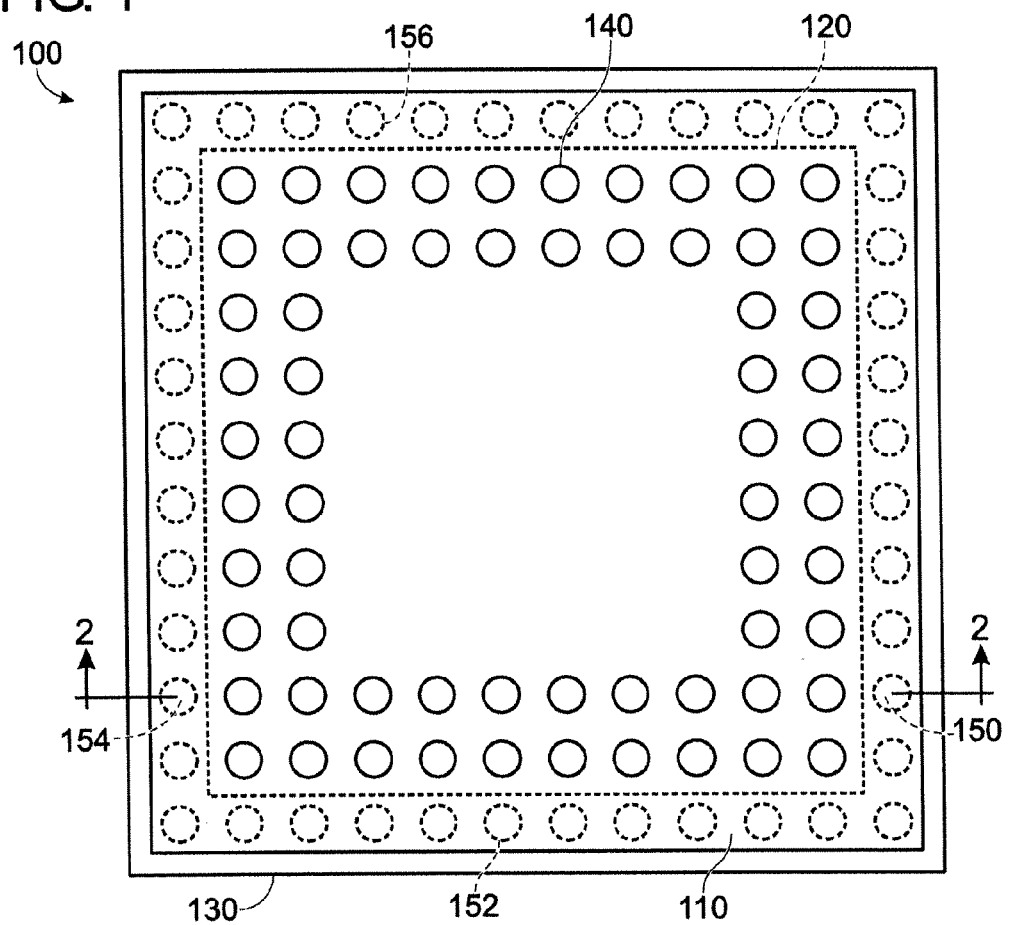
FIG. 1 is a plan view of one embodiment of a semiconductor package.

FIG. 1 is a plan view of one embodiment of a semiconductor package 100. The package 100 can comprise an interposer substrate 110 positioned effectively with respect to a semiconductor die 120, such as on top of the die 120 (indicated by a dotted outline in this view) and a base substrate 130. In some embodiments, the substrates 110 and 130 have approximately the same horizontal area. In other embodiments they can have substantially different horizontal areas. The embodiment of FIG. 1 shows the substrate 110 as being slightly smaller than the substrate 130. The interposer substrate 110 can comprise one or more I/O terminals 140 that can be arranged as desired for electrically coupling to the die 120 or the base substrate 130.

Figure 2:
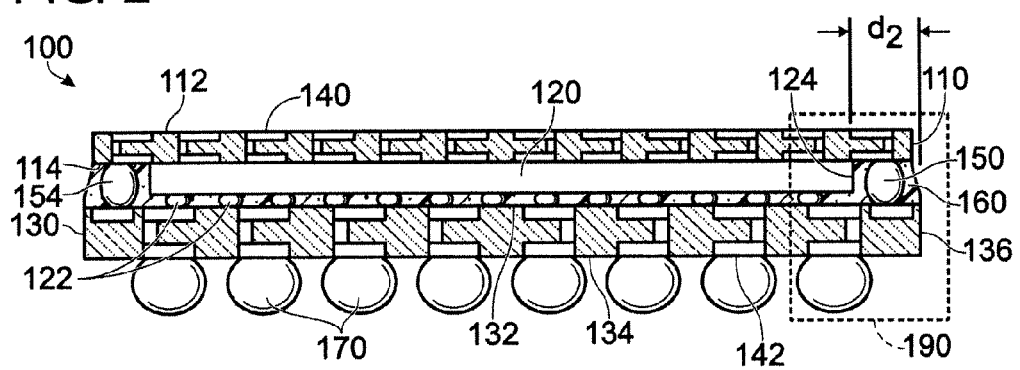
FIG. 2 shows a side cross-sectional view of the package of FIG. 1.

FIG. 2 shows a side cross-sectional view of the package 100 taken along the line 2-2 in FIG. 1. As shown in FIG. 2, the interposer substrate 110 comprises two major planar opposed surfaces, namely a top surface 112 and a bottom surface 114, defined by a perimeter formed by the edges of the substrate 110. The base substrate 130 similarly comprises two major planar opposed surfaces, namely a top surface 132 and a bottom surface 134, defined by a perimeter formed by the edges of the substrate 130. The base substrate 130 can comprise one or more I/O terminals 142 that can be similar to the I/O terminals 140 of the interposer substrate 110. (Some features in the figures, e.g., the terminals 140, 142, are depicted in simplified versions in order to more clearly illustrate other features of the embodiments.) The terminals 140, 142 can be configured to carry electrical signals between one point on a substrate surface to another point on the surface, or between different substrate surfaces.

In the embodiment of FIG. 2, the die 120 is mounted in a flip chip configuration, with a plurality of solder balls 122 or similar electrical connections electrically coupling the die 120 to one or more of the base substrate terminals 142. The base substrate 130 can be electrically coupled to the interposer substrate 110 through one or more vertical connectors such as representative vertical connectors 150, 154. In this way, electrical connections from the base substrate 130 can be "wrapped around" the die 120 to the interposer substrate 110. In some embodiments, the vertical connectors 150 do not extend horizontally beyond the edges of the substrates 110, 130, permitting compact packages.

Figure 10:
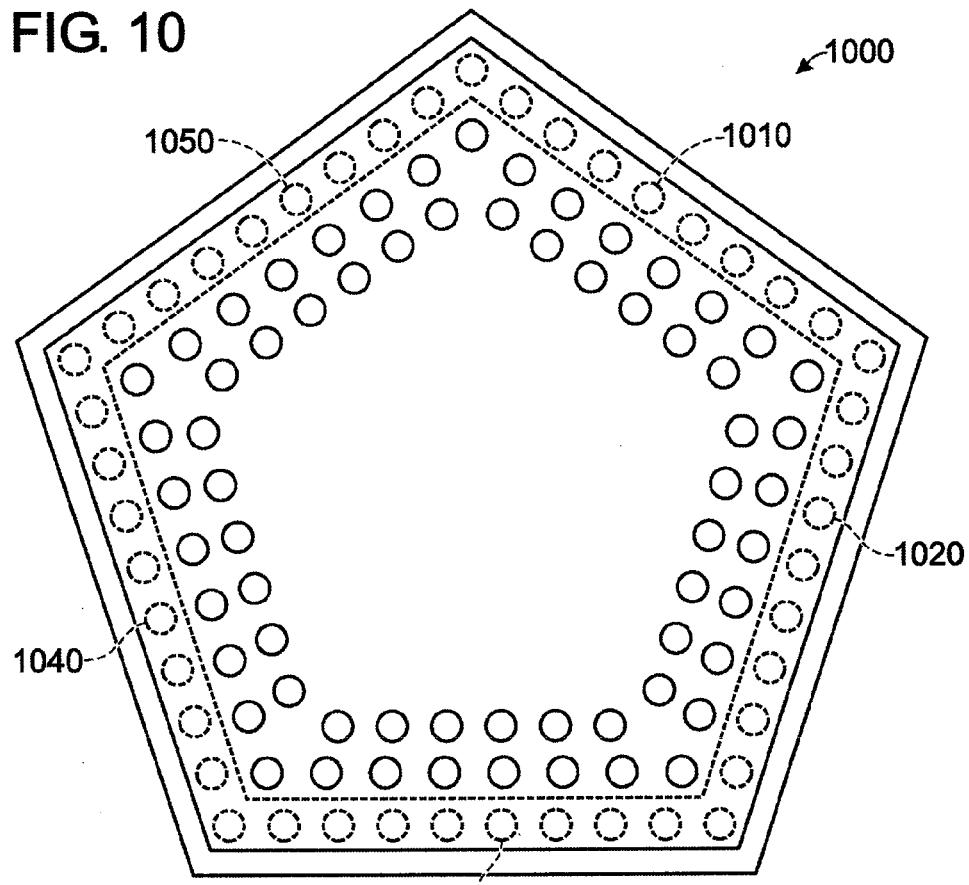
FIG. 10 is a plan view of one embodiment of a semiconductor package.

As shown in FIG. 1, the package 100 can be configured such that vertical connectors are positioned near one, two, three, four or more edges of the package 100, as exemplified by the vertical connectors 150, 152, 154, 156. FIG. 10 shows a plan view of an exemplary embodiment of a package 1000 configured such that vertical connectors are positioned near five edges of the package 1000 (see, e.g., vertical connectors 1010, 1020, 1030, 1040, 1050). Exemplary embodiments of such connectors are described below. As shown in FIG. 2, the package 100 can further comprise a material 160 between the substrates 110, 130, as well as between the die 120 and one or both of the substrates 110, 130. In some embodiments, material 160 comprises an encapsulating resin and is applied through an underfill process (e.g., needle dispensing, no-flow-underfill). As used in this specification and in the claims, an "encapsulating resin" refers to a material in the package that: generally defines a space between two or more components; serves to at least partially fill a gap between two or more components; and/or is situated at the perimeter of one or more substrates to at least partially define a shape of a package and/or seal a region of the package. The encapsulating resin can provide, e.g.: a predetermined thermal conductivity; a predetermined electrical conductivity; and a barrier to environmental contaminants. A number of suitable materials can be used for the encapsulating resin, for example, an epoxy material, a thermosetting material, or a thermoplastic material. In some embodiments these materials are used with filler particles, and in other embodiments they are used without filler particles. In other embodiments, material 160 is applied using an overmolding encapsulation process. (To provide a clearer view of the base substrate 130, the material 160 is not shown in FIG. 1.) Solder balls 170 or other electrical connections can be provided to electrically couple the base substrate 130 to other circuit elements or components, such as, for example, a printed circuit board.

The package 100 can be configured such that the area occupied by the package 100 on a mounting surface (e.g., a printed circuit board) is only slightly larger than the horizontal area of die 120. In some embodiments, a distance $d_2$ between an edge 124 of the die 120 and an edge 136 of the base substrate 130 (or, similarly, an edge of the interposer substrate 110) is between about 0.25 mm and about 1 mm. A similar distance in some chip-scale package (CSP) designs can be, for example, about 2 mm to about 3 mm. However, the package 100 can also be designed such that its area is much larger than the area of the die 120. In further embodiments, the package 100 can comprise multiple semiconductor die (not shown) positioned on and electrically coupled to the base substrate 130.

Figure 11:
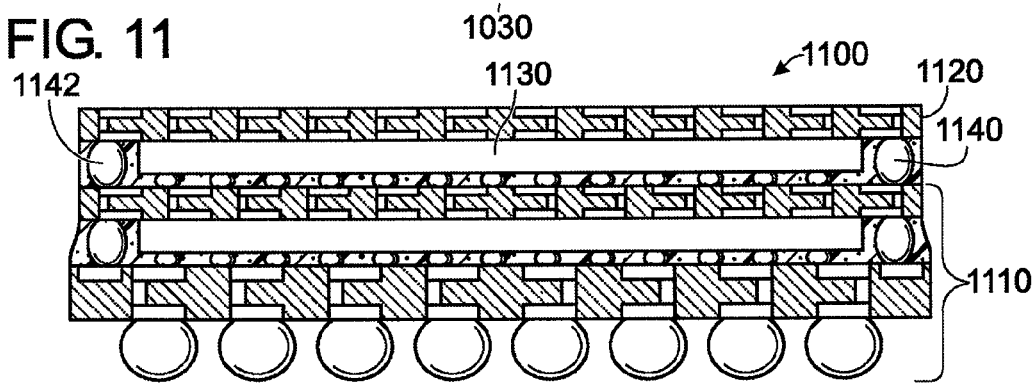
FIG. 11 is a side cross-sectional view of an embodiment of a semiconductor package.

In other embodiments, the top surface 112 of the substrate 110 is occupied at least in part by an additional semiconductor die (or other electronic component) coupled to the terminals 140, 142. FIG. 11 shows a side cross-sectional view of an exemplary embodiment of a package 1100 comprising a portion 1110 similar to the package 100. The package 1100 further comprises an additional substrate 1120 (possibly similar to the substrates 110, 130) positioned on top of an additional die 1130, with vertical connectors 1140, 1142 (possibly similar to the vertical connectors 150, 152, 154, 156) electrically coupling the additional substrate 1120 to the terminals 140, 142. Thus, the package 1100 can comprise multiple die sandwiched among multiple layers of substrates.

One advantage of some configurations of the package 100 is that I/O terminals can be configured to emerge on both the top and bottom surfaces of the package. Additionally, most or all of the top surface 112 of the interposer substrate 110 can be available for the terminals 140. The top surface 112 can present a flat or approximately flat mounting surface, whereas other packages sometimes have a raised feature, such as a mold cap for a die that interrupts the mounting surface. These features of the package 100 can facilitate three-dimensional integration of multiple semiconductor components.

Figure 3:
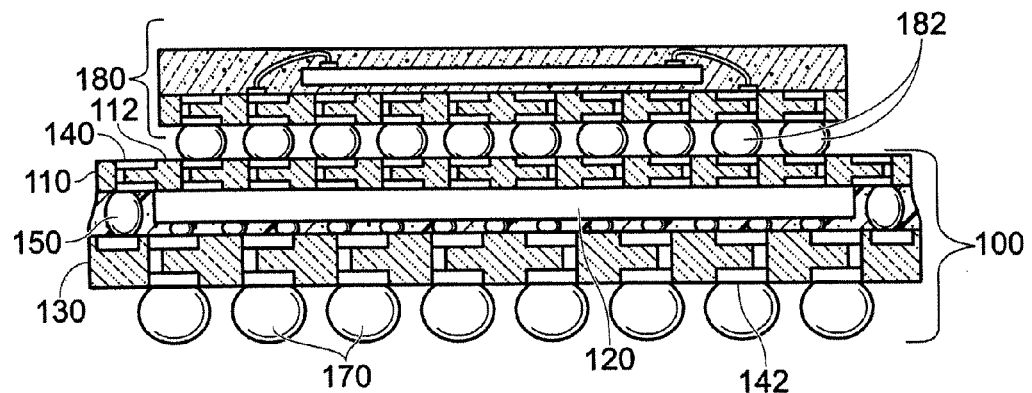
FIG. 3 shows a side cross-sectional view of the package of FIG. 1 with an additional semiconductor package.

In a further embodiment, FIG. 3 shows a side cross-sectional view of the package 100 with an electronic component 180 mounted on top of the package 100. The electronic component 180 can be electrically coupled to the package 100 through the one or more of the terminals 140 at the top surface 112 of the interposer substrate 110. In one embodiment, the terminals 140, 142 and the vertical connectors 150, 152, 154, 156 can be configured to electrically couple the electronic component 180 and the die 120. In another embodiment, the terminals 140, 142 and the vertical connectors 150 can be configured to provide one or more electrical connections between the electronic component 180 and solder balls 170. In a further embodiment, the terminals 140, 142 and the vertical connectors 150 can be configured to create electrical connections between the electronic component 180, the die 120 and the solder balls 170.

In some embodiments, the die 120 of the package 100 is a microprocessor or other microchip and the electronic component 180 is a package containing a memory element that can operate in conjunction with the die 120. In other embodiments, the electronic component 180 comprises, e.g., one or more additional processors, one or more discrete components (e.g., passive or active), a flip chip component, a quad flat package (QFP), a quad flat package no leads (QFN), a molded package, or combinations thereof.

FIG. 3 depicts the electronic component 180 as comprising a ball grid array (BGA) 182 for connecting to the interposer substrate 110. Some semiconductor packages provide a mounting surface along the peripheral area of the package for receiving a BGA, with a raised feature in the center of or near the mounting surface (e.g., a mold cap for a die in the package). When an additional device using a BGA is mounted on such a package, the ball pitch of the BGA is usually chosen to be large enough to lift the additional device over the raised feature. In such devices, the ball pitch can be, for example, about 0.65 mm. In some embodiments of the package 100 in FIG. 3, the generally level top surface 112 of the interposer substrate 110 does not require the BGA 182 of the electronic component 180 to lift the electronic component 180 over a raised area. Accordingly, the pitch of the BGA 182 can be smaller than in at least some prior art designs. This smaller BGA pitch can allow for a smaller overall package height (e.g., in some embodiments, about 0.28 mm from the bottom surface 134 of the substrate 130 to the top surface 112 of the substrate 110), as well as for a higher-density BGA 182. For example, in some embodiments the ball pitch can be between about 0.25 mm and 0.3 mm, but in other embodiments, the ball pitch can be smaller or larger. In some further embodiments, the electronic component 180 can be connected to the substrate 110 using wire bonding or other techniques known in the art. In alternative embodiments of the package 100, the top surface 112 of the interposer substrate 110 can comprise one or more raised features.

Figure 4:
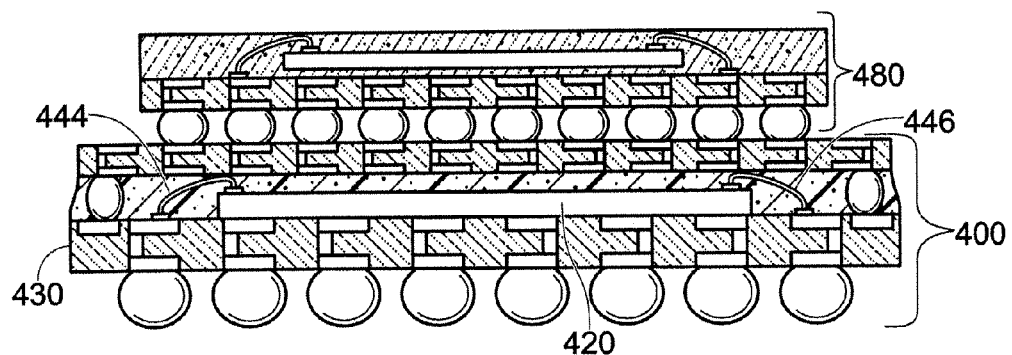
FIG. 4 is a side cross-sectional view of an alternative embodiment of a disclosed semiconductor package.
Figure 12:
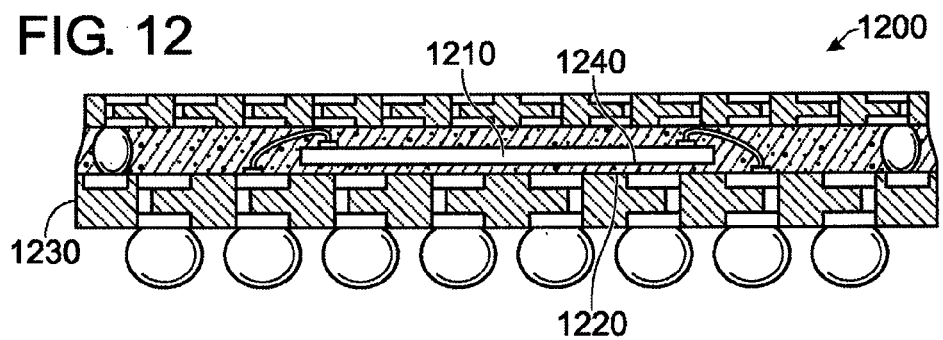
FIG. 12 is a side cross-sectional view of an embodiment of a semiconductor package.

FIG. 4 is a side cross-sectional view of a semiconductor package 400. In this embodiment the package 400 is similar to the package 100. But, for the embodiment of FIG. 4, a die 420 is configured not as a flip chip but as a wire-bonded die with bond wires 444, 446 electrically coupling the die 420 to a base substrate 430. A semiconductor package 480 (or other electronic component) can be mounted on top of the package 400. FIG. 12 is a side cross-sectional view of a further exemplary embodiment of a semiconductor package 1200. This embodiment is similar to the package 400 in that it comprises a die 1210 coupled to a surface 1220 of a substrate 1230 in a wire-bond configuration. In the package 1200, the die 1210 is at least partially separated from the substrate surface 1220 by a layer of encapsulating resin 1240.

Several embodiments of the vertical connectors 150 can be used in the packages 100, 400. FIG. 5 is an enlargement of the region 190 of FIG. 2 showing one embodiment of a vertical connector 550 for electrically coupling an interposer substrate 510 and a base substrate 530. Also shown in this enlargement view are an encapsulating resin (e.g., an epoxy material, a thermosetting material, or a thermoplastic material) 560 and a die 520, the die 520 being electrically coupled to the base substrate 530 by one or more solder balls 522 or similar connectors. An attachment layer 524, comprising an adhesive, for example, can provide a physical connection between the substrate 510 and the die 520. In some embodiments of the package shown in FIG. 5 (and in some embodiments of the packages shown in FIGS. 6 and 7 below), the space occupied by a layer such as the attachment layer 524 can be filled instead with a molding compound. However, in order to allow the molding compound to penetrate to this region, an adequate clearance for the molding should be provided between the top of the die 520 and the bottom of the interposer substrate 510. The necessary "mold clearance" is usually at least about 0.2 mm. Thus, in some embodiments, package height can be reduced by not placing molding compound between the top of the die 520 and the bottom of the interposer substrate 510. As is further shown in the depicted embodiment, the vertical connector 550 comprises a conductive bead 552 electrically coupled to a conductive trace 556 on the interposer substrate 510. The bead 552 is also electrically coupled to a lead 554 to form a bond-on-lead (BOL) connection. The lead 554 can be further electrically coupled to a conductive trace 558 on the base substrate 530. The bead 552 can comprise one or more conductive materials, such as gold or solder, and can be applied to the trace 556 using solder-on-pad (SOP) technology, or can be otherwise coupled to the trace 556.

FIG. 6 is an enlargement of the region 190 of FIG. 2 showing a further embodiment of a vertical connector 650 for electrically coupling an interposer substrate 610 and a base substrate 630. Also shown in this enlargement view are an encapsulating resin (e.g., an epoxy material, a thermosetting material, or a thermoplastic material) 660 and a die 620, the die 620 being electrically coupled to the base substrate 630 by one or more solder balls 622 or similar connectors. An attachment layer 624, comprising an adhesive, for example, can provide a physical connection between the substrate 610 and the die 620. In this embodiment, the vertical connector 650 comprises a conductive bead 652 that is electrically coupled to a conductive trace 656 on the interposer substrate 610. The bead 652 can comprise one or more conductive materials, such as gold or solder, and can be applied to the trace 656 using solder-on-pad (SOP) technology, as is well known in the art. The solder bead 652 also can be electrically coupled to a stud bump 654, which can comprise a number of different stud bump materials known in the art. In some embodiments, the stud bump 654 is comprised of gold. The stud bump 654 can be further electrically coupled to a conductive trace 658 on the base substrate 630.

FIG. 7 is an additional embodiment of the region 190 of FIG. 2. This embodiment shows a solder ball 750 acting as a vertical connector between a base substrate 730 and an interposer substrate 710. The solder ball 750 is electrically coupled to a conductive trace 756 on the interposer substrate 710 and to a conductive trace 758 on the base substrate 730. Also shown in this enlargement are a die 720 electrically coupled to the base substrate 730 with one or more solder balls 722 or similar connectors, as well as an encapsulating resin (e.g., an epoxy material, a thermosetting material, or a thermoplastic material) 760. An attachment layer 724, comprising an adhesive, for example, can provide a physical connection between the substrate 710 and the die 720.

A given package configuration can be configured to use one or more of the vertical connector embodiments described above, as well as other types of vertical connectors.

Packages using the vertical connectors depicted in FIGS. 5 and 6 can be configured to be more compact than packages using the vertical connector depicted in FIG. 7. The vertical connector embodiments of FIGS. 5 and 6 can be configured to use traces (e.g., traces 556, 558 of FIG. 5 and traces 656, 658 of FIG. 6) that are smaller than the corresponding traces used by the vertical connector embodiment of FIG. 7 (e.g., traces 756, 758). Accordingly, the vertical connectors of FIGS. 5 and 6 can allow for improved routing efficiency in a given substrate space, as well as a shorter distance d between the edge of the die and the edge of the largest substrate (which, in the embodiments of FIGS. 5-7, are the base substrates 530, 630, 730, respectively). The distance d is indicated in FIGS. 5, 6 and 7 by $d_5$, $d_6$ and $d_7$, respectively. In the depicted embodiments, $d_7 > d_5$ and $d_7 > d_6$. The distance d can be approximately the same as the width of a vertical connector. This can, in turn, allow for a package with a horizontal size that is close to that of the packaged die.

Exemplary Embodiments of the Disclosed Method

Figure 8:
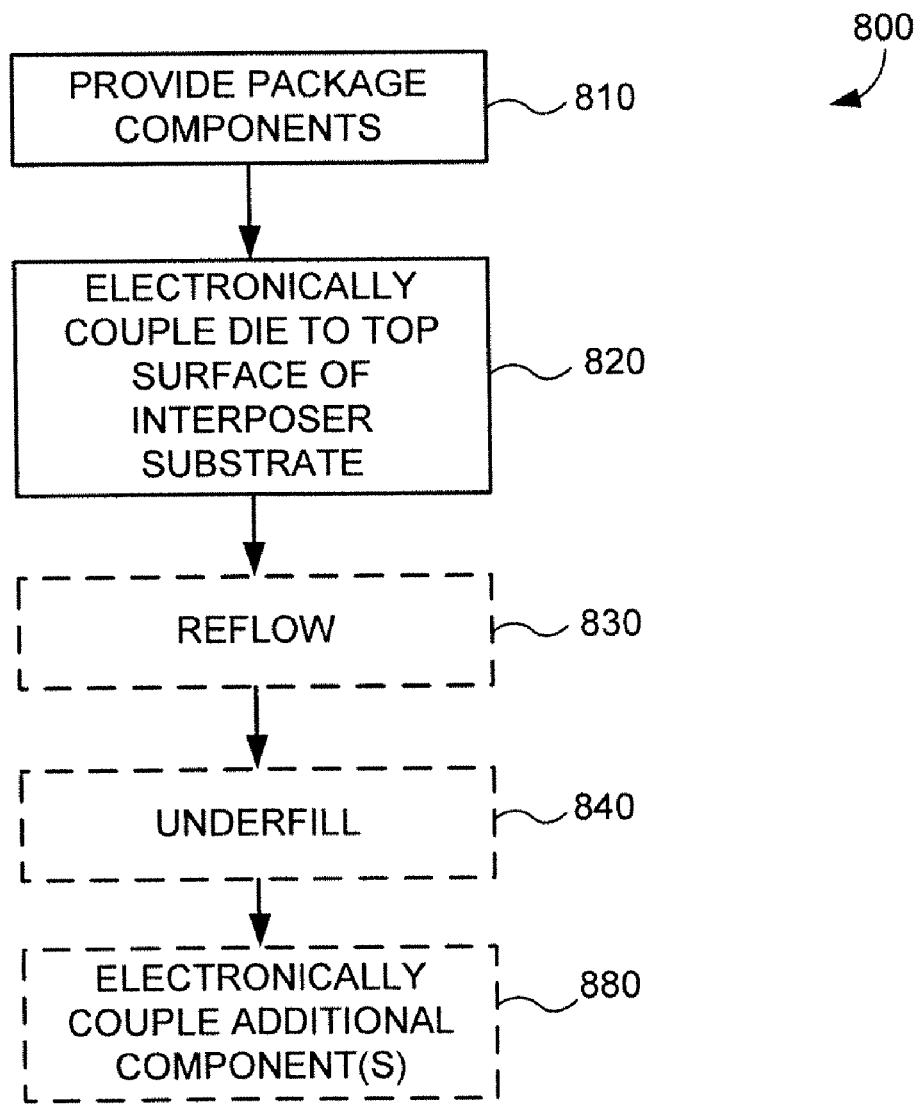
FIG. 8 is a flowchart of one embodiment of a method of making a semiconductor package.

FIG. 8 is a flowchart of an exemplary embodiment of a method 800 of making a semiconductor package. Package components are provided in a step 810. These components can include a base substrate, an interposer substrate, a semiconductor die, and one or more vertical connectors. The base and interposer substrates both have a top surface and a bottom surface. In some embodiments, one or more components can be provided simultaneously or approximately simultaneously. For example, the vertical connectors and the interposer substrate can be provided simultaneously. The die is electrically coupled to the top surface of the interposer substrate in a step 820.

Figure 9:
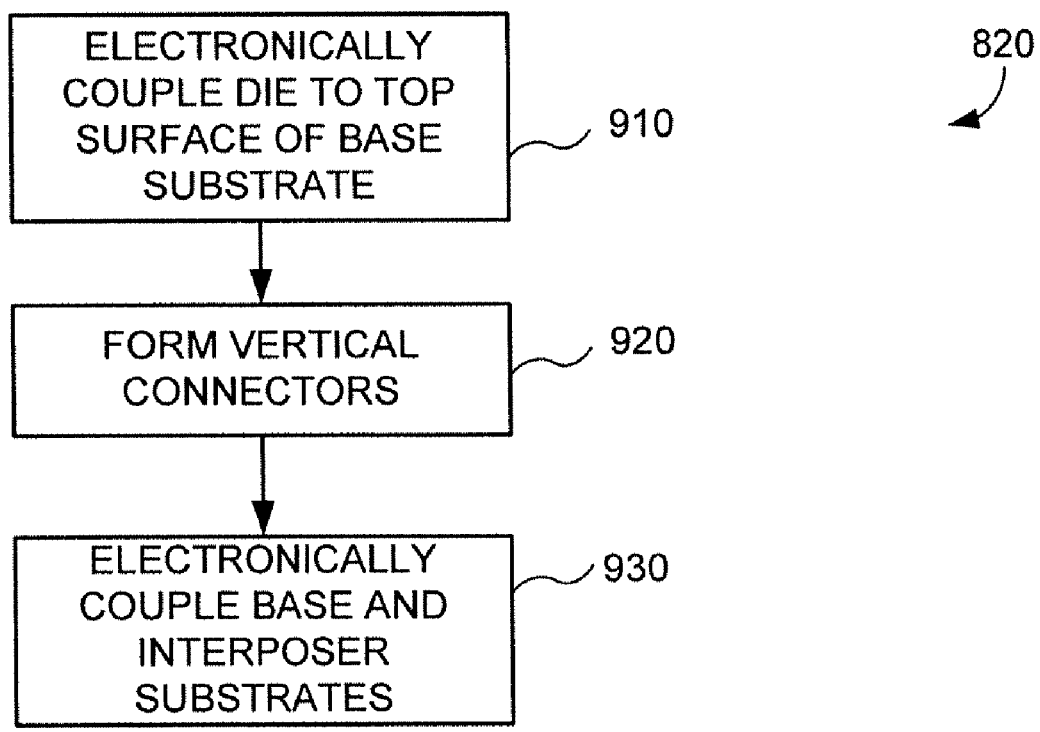
FIG. 9 is a flowchart of one embodiment of a method of electrically coupling a die to a top surface of an interposer substrate.

FIG. 9 is a flowchart of one embodiment of a method for carrying out step 820 of FIG. 8. The method can comprise electrically coupling the die to the top surface of the base substrate (step 910). As described above, the die and the base substrate can be electrically coupled using a number of configurations known in the art, such as a wire bond configuration or a flip chip configuration. One or more vertical connectors can be formed (e.g., on the top surface of the base substrate, on the bottom surface of the interposer substrate, or both) (step 920). The base and interposer substrates can be electrically coupled through the vertical connectors (step 930). In further embodiments, the interposer substrate can be provided by a pick-and-place process, possibly simultaneously, or approximately simultaneously, with the die being coupled to the base substrate.

Returning to FIG. 8, in additional embodiments, the method 800 optionally can further comprise one or more reflow steps 830. A refill step can be used for packages with die employing a flip chip configuration, as well as for packages employing the vertical connector configurations described in FIGS. 5-7. In some embodiments, a first reflow step can occur after the die is placed and a second reflow step can occur after the interposer substrate is placed. In other embodiments, a single reflow step can be used for both the die and the vertical connectors between the base and interposer substrates.

In other embodiments, the method 800 optionally can further comprise one or more underfill steps 840. In some embodiments, if the die is electrically coupled to the base substrate in a flip chip configuration, the die can be underfilled using an encapsulating resin (e.g., an epoxy material, a thermosetting material, or a thermoplastic material), as is well known in the art. The space between the interposer substrate and the base substrate can also be underfilled, possibly in a later, additional step. When a flip chip die is underfilled, the encapsulating resin can create a fillet around the edge of the chip that extends out along the top surface of the base substrate. If the vertical connectors are added after this fillet forms, they can be placed outside the fillet perimeter. However, this increases the amount of space used on the top surface of the base substrate, and the surface beneath the fillet (sometimes referred to as a "keep-out region") is unavailable. This configuration can require a larger substrate and thus increase the size of the package. Multiple underfill steps can result in one or more interfaces between materials of the different underfill steps. In some embodiments, the flip chip and the interposer substrate are simultaneously underfilled after the vertical connectors are in place (in some embodiments, such that the encapsulating resin encompasses at least a portion of some of the vertical connectors). This can reduce the number of underfill steps 840, as well as allow for closer placement of the vertical connectors to the die (potentially allowing for a smaller package size).

For embodiments where the die is coupled to the base substrate in a wire bond configuration, the underfill step 840 can comprise underfilling a space between the face of the die and the interposer substrate, as well as a space between the interposer substrate and the base substrate. In other embodiments, the underfill step 840 can comprise covering the die (before placement of the interposer substrate) with an encapsulating resin through printing encapsulation (e.g., by printing a layer of material on top of the die). In such embodiments, at least part of the vertical connectors can be formed on the interposer substrate, and the interposer substrate can be placed (step 830) such that the vertical connectors are pushed through the printed encapsulating resin, the interposer substrate thereby becoming electrically coupled to the base substrate. A reflow step 830 can then be provided.

In further embodiments, an additional semiconductor component can be electrically coupled with the top surface of the interposer substrate (step 850). This can be done independently of any underfill or reflow steps.

The disclosed materials and structures, and embodiments of the method for making and using such materials and structures, should not be construed as limiting in any way. Instead, the present disclosure is directed toward all novel and nonobvious features, aspects, and equivalents of the various disclosed embodiments, alone and in various combinations and sub-combinations with one another. The disclosed technology is not limited to any specific aspect, feature, or combination thereof, nor do the disclosed materials, structures, and method require that any one or more specific advantages be present or problems be solved. We claim all that is encompassed by the following claims.

I claim:

1. A semiconductor package comprising:
a first substrate having first and second major planar surfaces defined by a first perimeter;
a first semiconductor die electrically coupled to the second major planar surface of the first substrate;
a second substrate having first and second major planar surfaces defined by a second perimeter;
a first plurality of vertical connectors, the connectors being configured to electrically couple the first major planar surface of the second substrate to the second major planar surface of the first substrate; and
a first encapsulating resin situated between the semiconductor die and the second major planar surface of the first substrate, the first encapsulating resin also encompassing at least a portion of at least some of the vertical connectors, wherein the vertical connectors are positioned substantially within the first perimeter and the second perimeter, and wherein the second major planar surface of the second substrate is substantially available for receiving one or more electronic components.

2. The semiconductor package of claim 1, wherein the first semiconductor die is electrically coupled to the second major planar surface of the first substrate in a flip chip configuration.

3. The semiconductor package of claim 1, wherein the first semiconductor die is electrically coupled to the second major planar surface of the first substrate with at least one bond wire.

4. The semiconductor package of claim 1, further comprising a second encapsulating resin situated between the second major planar surface of the first substrate and the first surface of the second substrate.

5. The semiconductor package of claim 4, wherein the first encapsulating resin and the second encapsulating resin comprise a continuous resin material.

6. The semiconductor package of claim 1, wherein at least one of the first plurality of vertical connectors comprises a bond-on-lead (BOL) connection.

7. The semiconductor package of claim 1, wherein at least a portion of one of the first plurality of vertical connectors comprises a stud bump.

8. The semiconductor package of claim 1, wherein the second major planar surface of the second substrate is configured to receive an electronic component.

9. The semiconductor package of claim 8, wherein the second major planar surface of the second substrate is further configured to receive a ball grid array, wherein at least a portion of the ball grid array has a ball pitch between about 0.25 mm and about 1.0 mm.

10. The semiconductor package of claim 8, wherein the second major planar surface of the second substrate is configured to receive at least one of the following: a flip chip component, a quad flat package, a quad flat package no leads, a molded package, or a passive component.

11. The semiconductor package of claim 1, wherein the first perimeter comprises a plurality of perimeter sides, and wherein at least some of the first plurality of vertical connectors are situated at two or more of the perimeter sides.

12. The semiconductor package of claim 11, wherein at least some of the first plurality of vertical connectors are situated at three or more perimeter sides.

13. The semiconductor package of claim 12, wherein at least some of the first plurality of vertical connectors are situated at four or more perimeter sides.

14. The semiconductor package of claim 1, wherein at least some of the first plurality of vertical connectors are generally diametrically opposed along at least one of the first and second perimeter.

15. The semiconductor package of claim 1, wherein the first substrate has a substrate edge and the first semiconductor die has a die edge, and wherein the horizontal distance between the die edge and the substrate edge is between about 0.25 mm and about 1.5 mm.

16. The semiconductor package of claim 15, wherein the horizontal distance between the die edge and the substrate edge is between about 0.25 mm and about 1.0 mm.

17. The semiconductor package of claim 1, wherein the first substrate has a substrate edge and the first semiconductor die has a die edge, and wherein the horizontal distance between the die edge and the substrate edge is approximately equal to a vertical connector width.

18. The semiconductor package of claim 1, wherein the vertical distance between a surface of the first semiconductor die facing the first substrate and the first major planar surface of the second substrate is less than about 0.2 mm.

19. The semiconductor package of claim 1, wherein the first encapsulating resin comprises at least one of an epoxy material, a thermosetting material, and a thermoplastic material.

20. The semiconductor package of claim 1, further comprising:

a third substrate having first and second major planar surfaces defined by a third perimeter;
a second semiconductor die electrically coupled to the second major planar surface of the third substrate; and
a second plurality of vertical connectors, the connectors being configured to electrically couple the first major planar surface of the first substrate to the second major planar surface of the third substrate.

21. A semiconductor package for a semiconductor die having a horizontal size, the semiconductor package having a horizontal size approximately the same as the horizontal size of the semiconductor die, the package comprising:

a first substrate having first and second major planar surfaces defined by a first perimeter, the second major planar surface having a semiconductor die coupled thereto; and
a second substrate consisting of first and second major planar surfaces defined by a second perimeter, the first major planar surface of the second substrate being effectively coupled to the second major planar surface of the first substrate by one or more vertical connectors, wherein the vertical connectors are positioned substantially within the first perimeter and the second perimeter, wherein the first substrate has a substrate edge and the die has a die edge, and wherein the horizontal distance between the die edge and the substrate edge is between 0.25 mm and 1.5 mm.

22. A semiconductor package comprising:

a first substrate having first and second major planar surfaces defined by a first perimeter;
a semiconductor die electrically coupled to the second major planar surface of the first substrate;
a second substrate having first and second major planar surfaces defined by a second perimeter, the second major planar surface of the second substrate comprising terminals electrically coupled to terminals on the first major planar surface of the second substrate;
a plurality of vertical connectors, the connectors being configured to electrically couple the first major planar surface of the second substrate to the second major planar surface of the first substrate; and
an encapsulating resin situated between the semiconductor die and the second surface of the first substrate, the encapsulating resin also encompassing at least a portion of at least some of the vertical connectors, wherein the vertical connectors are positioned substantially within the first perimeter and the second perimeter, and wherein the second major planar surface of the second substrate is substantially available for receiving one or more electronic components.

23. The semiconductor package of claim 22, wherein the terminals of the second major planar surface of the second substrate are configured to receive a discrete component.

24. The semiconductor package of claim 22, wherein the first substrate has a substrate edge and the semiconductor die has a die edge, and wherein the horizontal distance between the die edge and the substrate edge is between 0.25 mm and 1.5 mm.

* * * * *